United States Patent
Ma

(10) Patent No.: US 7,510,965 B2
(45) Date of Patent: Mar. 31, 2009

(54) METHOD FOR FABRICATING A DUAL DAMASCENE STRUCTURE

(75) Inventor: Hong Ma, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 151 days.

(21) Appl. No.: 11/564,847

(22) Filed: Nov. 30, 2006

(65) Prior Publication Data

US 2008/0132067 A1 Jun. 5, 2008

(51) Int. Cl.
*H01L 21/4763* (2006.01)

(52) U.S. Cl. .................. 438/638; 438/639; 438/667; 438/672

(58) Field of Classification Search .................. 438/637, 438/638, 639, 666, 667, 668, 672, 675, 700, 438/701
See application file for complete search history.

(56) References Cited

U.S. PATENT DOCUMENTS

| | | | |
|---|---|---|---|
| 6,042,996 A | 3/2000 | Lin et al. | |
| 6,093,508 A | 7/2000 | Cote | |
| 6,150,269 A | 11/2000 | Roy | |
| 6,554,004 B1 | 4/2003 | Nguyen et al. | |
| 6,649,531 B2 | 11/2003 | Cote et al. | |
| 6,797,627 B1 | 9/2004 | Shih et al. | |
| 6,872,666 B2 | 3/2005 | Morrow | |
| 7,045,464 B1* | 5/2006 | Biolsi et al. | 438/706 |
| 2002/0096494 A1 | 7/2002 | Lu et al. | |
| 2004/0007561 A1* | 1/2004 | Nallan et al. | 216/67 |
| 2004/0192058 A1* | 9/2004 | Chu et al. | 438/710 |
| 2006/0024971 A1 | 2/2006 | Park et al. | |

* cited by examiner

*Primary Examiner*—Kevin M Picardat
(74) *Attorney, Agent, or Firm*—Winston Hsu

(57) ABSTRACT

A method for fabricating a dual damascene structure contains providing a substrate having a conductive layer, an etching stop layer, a dielectric layer, and a photoresist layer thereon, performing an etching process to remove a portion of the dielectric layer through a via pattern of the photoresist layer for forming a via structure in the dielectric layer, providing CO-containing gas to perform an ash process, filling GFP materials into the via structure, forming a photoresist layer with a trench pattern on the substrate, etching the dielectric layer through the trench pattern to form a trench structure in the dielectric layer, above the via structure, and removing the etching stop layer exposed in the via structure.

30 Claims, 19 Drawing Sheets

METHOD FOR FABRICATING A DUAL DAMASCENE STRUCTURE

BACKGROUND OF THE INVENTION

1. Field of the Invention

The present invention relates to a method for fabricating a dual damascene structure, and more particularly, to a method for fabricating a dual damascene structure by using carbon monoxide (CO) and deionized (DI) water for efficiently cleaning residues in a via hole after an etching process.

2. Description of the Prior Art

A dual damascene process provides a method of forming a metal wire coupled with a via plug as a stack structure. The dual damascene structure is used to connect devices and wires in different layers of a semiconductor wafer and is insulated from other devices by the inter-layer dielectrics (ILD) around it. The copper damascene processes, which incorporate copper as the conductive material of dual damascene structures, are common in the art. The copper damascene processes provide a solution to form a metal wire of semiconductor processes under 0.18 or deep sub-micro micron generations in high integration and high processing speed logic integrated circuit (IC) chip fabrication method. Since copper has low resistance (30% lower than aluminum), better electromigration resistance and low-k materials, it is capable of reducing RC delays between metal wires. Accordingly, copper damascene processes become more and more important in IC processes. Typically, the dual damascene process encompasses trench-first, via-first, partial-via, and self-aligned processes, in which the via-first dual damascene process comprises first defining a via opening in dielectric layers and then defining a trench above the via opening by using several lithographic and etching steps.

Please refer to FIGS. 1-4, which are schematic diagrams of via-first dual damascene process according to the prior art. As shown in FIG. 1, a semiconductor device 10 comprises a substrate 12 having a conductive layer 14, a dielectric layer 18, and a photoresist layer 20 disposed on the substrate 12 form bottom to top. An etching stop layer 16 may also be formed on the surface of the conductive layer 14. A photolithography process is performed to pattern the photoresist layer 20 so as to form a via pattern 22 on the photoresist layer 20.

As shown in FIG. 2, an etching process is performed to remove a portion of the dielectric layer 18 through the via pattern 22, until the surface of the etching stop layer 16, for forming a via hole 24. However, residues 26 are formed on the sidewall or bottom corner of the via hole 24 together with the etching process, wherein the residues 26 usually comprises high-molecule polymers with carbon, silicon, nitrogen, fluorine, titanium, or other impurities. The residues 26 covering the surface of the via hole 24 influence the critical dimension (CD) of following processes and performance of the semiconductor device 10, such as the quality of contact plug in the via hole 24, resulted in reaction chamber memory effect.

With reference to FIG. 3, an ash process is carried out to remove the photoresist layer 20. In the prior art, oxygen ($O_2$) is usually used to remove the photoresist layer 20. In addition, the ash process may be carried out by combining oxygen with nitrogen ($N_2$) or a little amount of tetrafluoromethane ($CF_4$). Although the ash process causes an efficient removal of the photoresist layer 20 and a breakdown of polymer bonds of the residues 26 present in the sidewall at the bottom of the via hole 24, photoresist residues 30 may be newly formed on the dielectric layer 18. However, the ash process is not able to effectively remove the fluorine-containing residues 26. On the other hand, although the process by combining oxygen with 4-5% of $CF_4$ helps to remove the polymer residues 26, the method of removing the photoresist layer 20 that utilizes fluorine-containing gas easily remains fluorine-containing residues 28, 32 on the sidewall or bottom corner of the via hole 24 and the surface of the dielectric layer 18, these residues 28, 30, 32 also affect the performance of following processes and electric quality of contact plug that will be formed later. As a result, liquid solvent having high cost has to be used to clean the semiconductor device 10 in conventional method. After the residues 28, 30, 32 are removed by the high-cost liquid solvent, a trench structure can be formed.

Referring to FIG. 4, a patterned photoresist layer (not shown) is formed on the dielectric layer 18, wherein the patterned photoresist layer has a trench pattern. Thereafter, the dielectric layer 18 is etched through the trench pattern so as to form a trench structure 34 on the upper portion of the dielectric layer 18. Finally, the patterned photoresist layer and a portion of the etching stop layer 16 are removed to expose the conductive layer 14 in the via hole 24, and the fabrication of the dual damascene opening is formed.

As mentioned above, it is easily to remain residues on the surface of the via hole during forming the via hole. In addition, the process of removing the photoresist layer by fluorine-containing gas, such as $CF_4$, also forms residues on the via hole or the dielectric layer. The above-mentioned residues have to be cleaned through using high-cost solvent. Since the costs of solvent or chemical materials are generally one of the keys of semiconductor process cost, how to improve the dual damascene fabrication method to reduce process cost is still an important issue for the manufacturers.

SUMMARY OF THE INVENTION

It is therefore a primary objective of the claimed invention to provide a method for fabricating a dual damascene structure by utilizing carbon monoxide and DI water for removing photoresist layer and residues so as to solve the above-mentioned problem of using high-cost solvent for cleaning via hole in the prior art.

According to the claimed invention, the method for fabricating a dual damascene structure comprises providing a substrate with a conductive layer, a first etching stop layer, a dielectric layer, and a first photoresist layer disposed on the surface of the substrate in order, patterning the first photoresist layer to define a via pattern on the first photoresist layer, and performing a first etching process to remove a portion of the dielectric layer through the via pattern, until exposing the etching stop layer, for forming a via hole structure in the dielectric layer. Then, a first ash process is performed to remove the first photoresist layer, wherein the ash process is carried out through providing a CO-containing gas. Thereafter, gap-fill polymer (GFP) materials are formed in the via hole structure. A second photoresist layer is formed on the surface of the substrate. Thereafter, the second photoresist layer is patterned to define a trench pattern, and a second etching process is performed to etch the dielectric layer through the trench pattern so as to form a trench structure in the upper portion of the dielectric layer, wherein the trench structure exposes the via hole structure. Finally, the second photoresist layer and the first etching stop layer exposed by the via hole structure are removed.

According to the claimed invention, a method for cleaning a via hole structure is further provided. The method comprising providing a semiconductor device having a via hole structure formed through an etching process, wherein the via hole is positioned in a dielectric layer and has after-etching residues therein. A reaction chamber is provided for containing the semiconductor device. Then, CO-containing gas is introduced into the reaction chamber.

It is an advantage of the present invention that CO-containing gas is used to perform the ash process because it is helpful to remove the residues in the via hole so as to avoid memory effects in the following forming processes of conductive material in the dual damascene structure, caused by the residues to affect, and to avoid the changes of CD and performance of the dual damascene structure. Furthermore, the present invention may further use DI water to help cleaning the via hole, replacing high-cost solvent in the prior art, and effectively reduce process cost and raise product profits.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
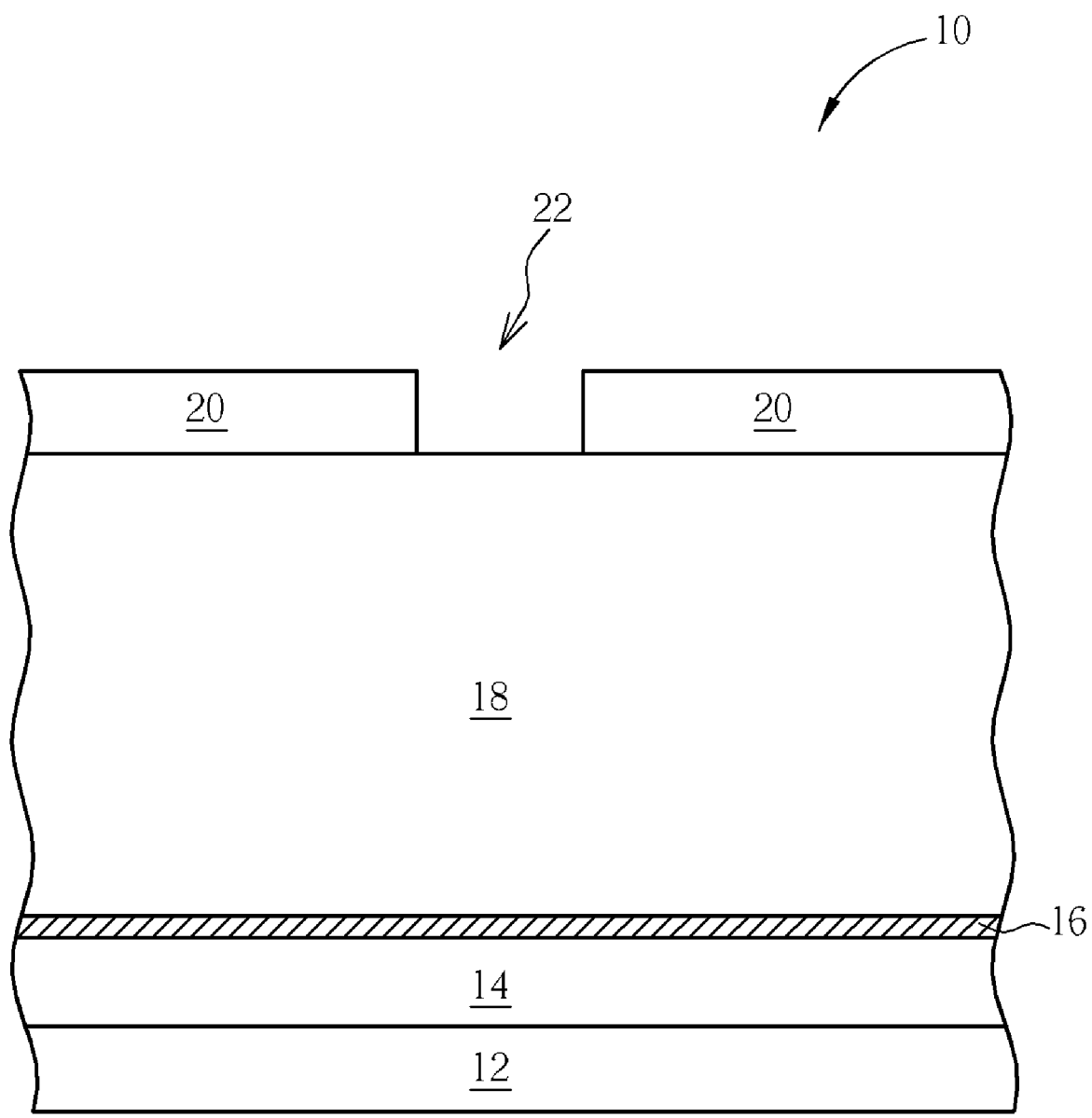
FIGS. 1-4 are schematic diagrams of via-first dual damascene process according to the prior art.
Figure 2:
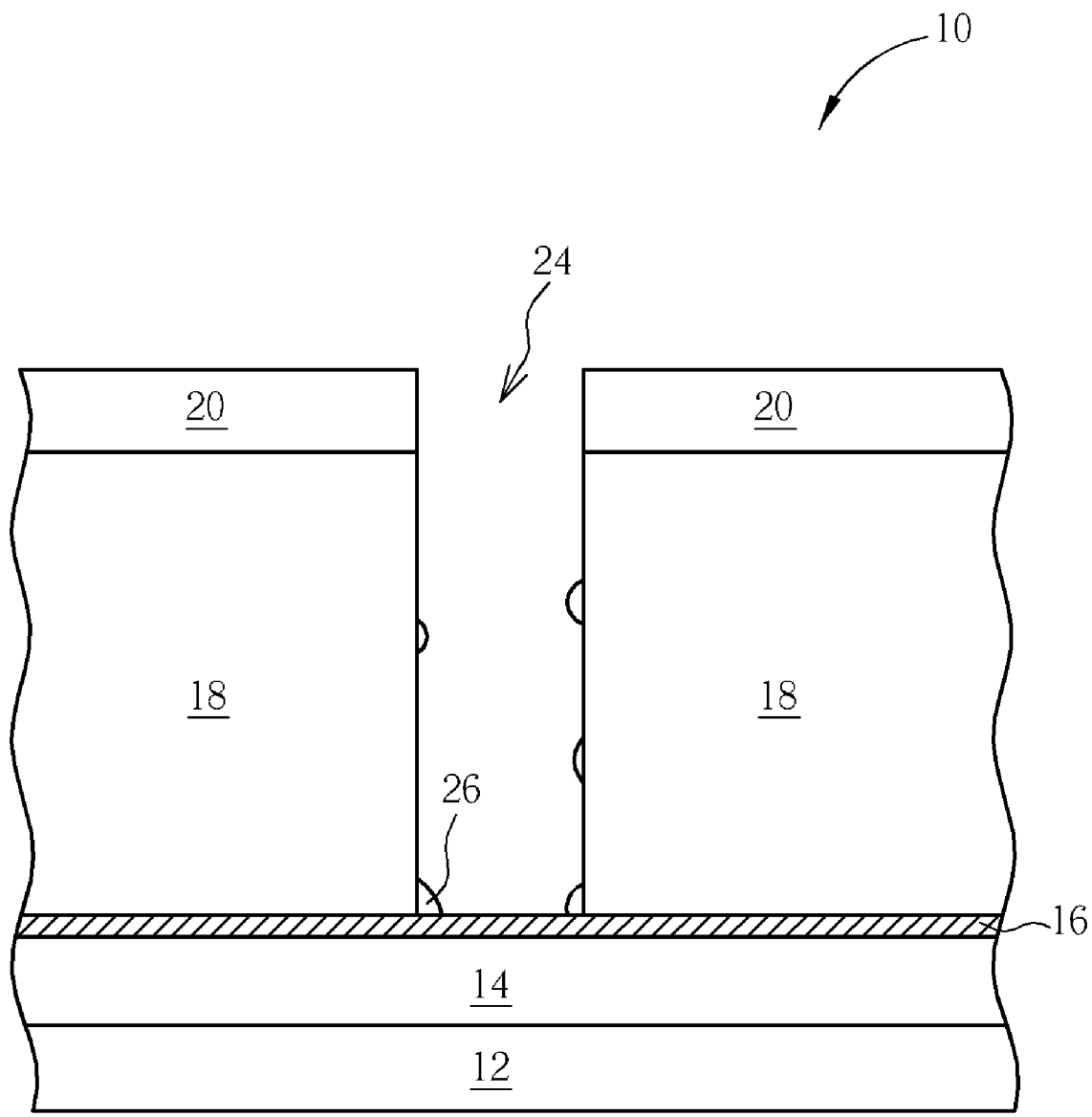
Figure 3:
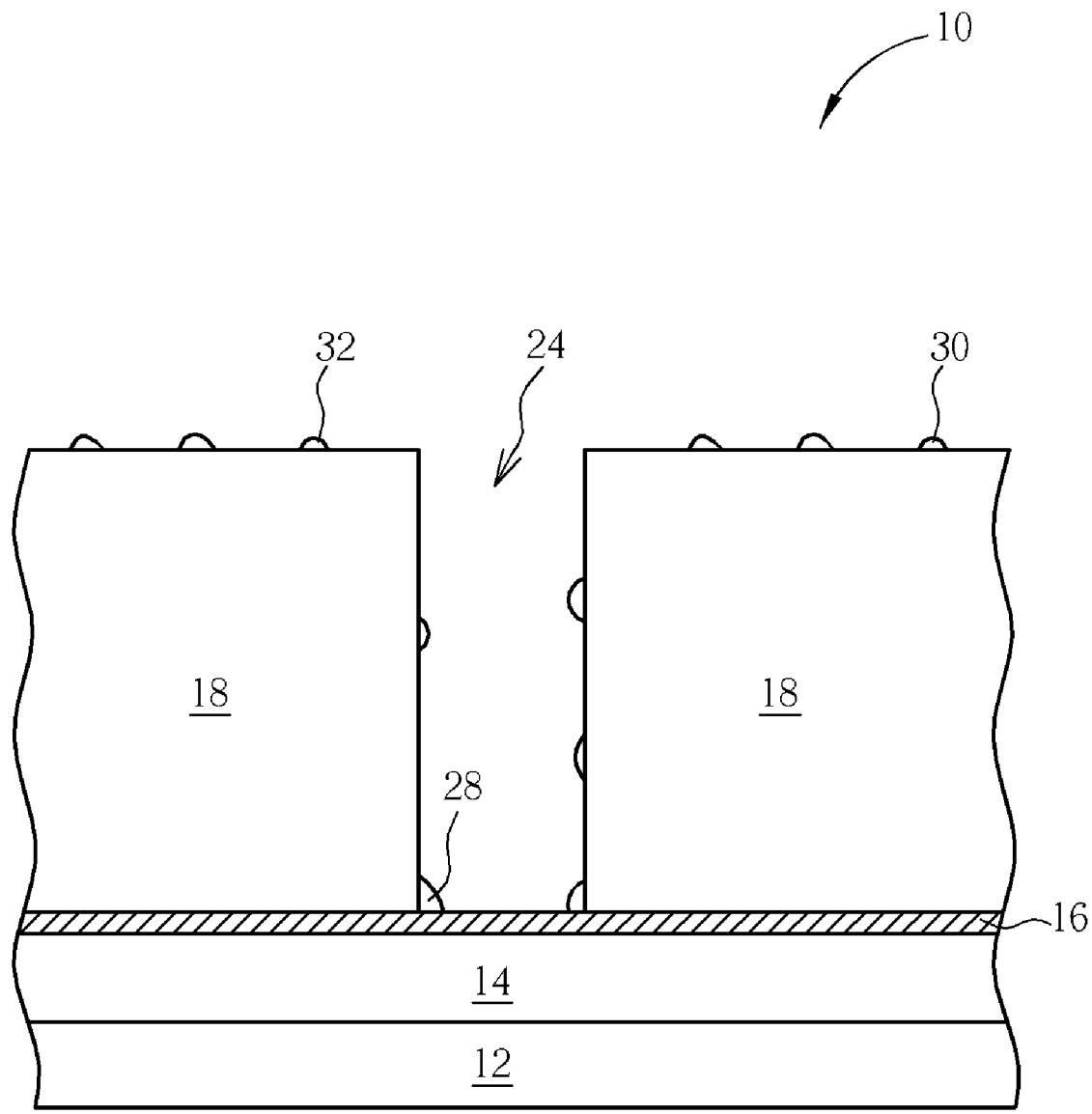
Figure 4:
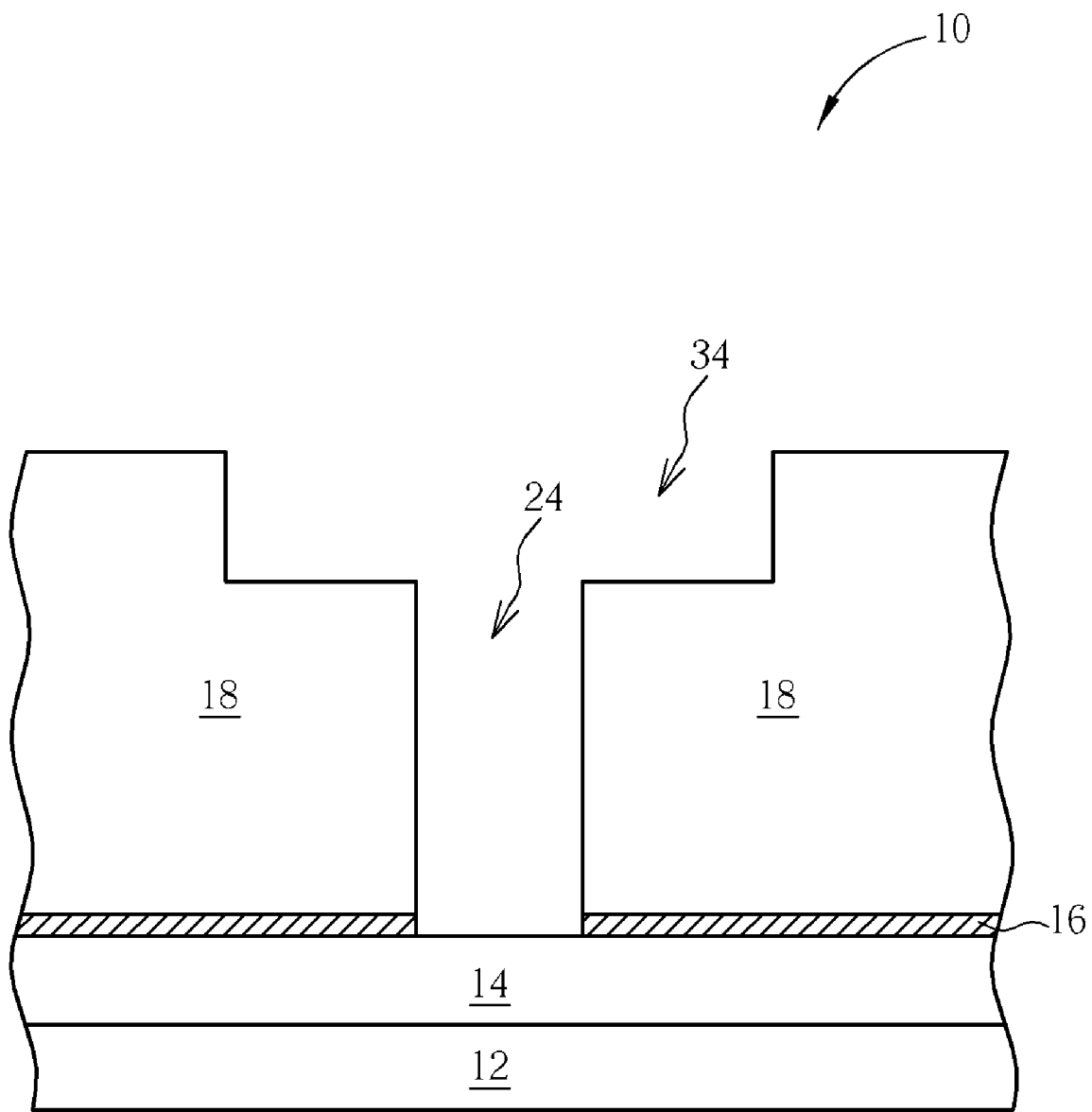
Figure 5:
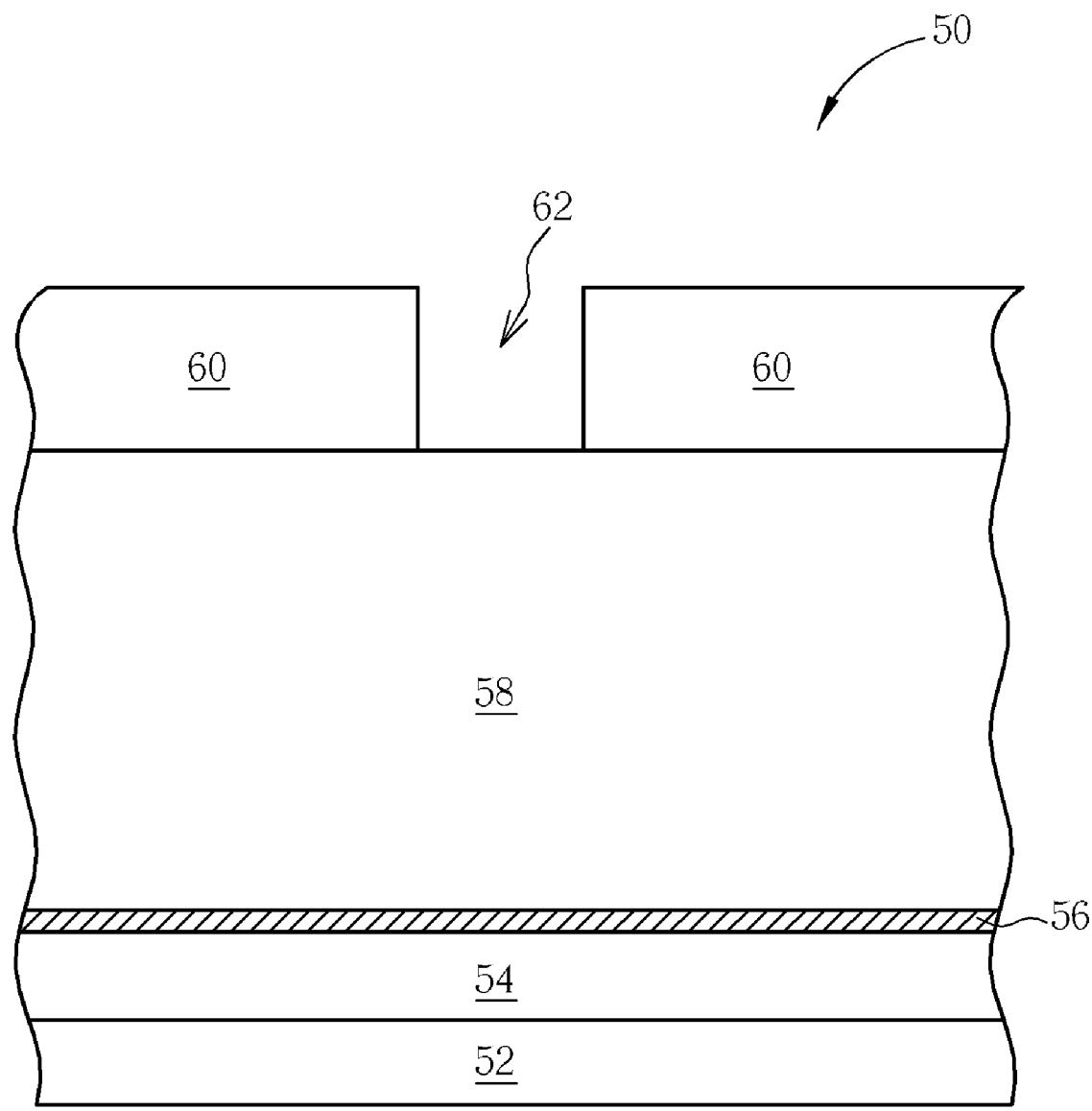
FIGS. 5-13 are schematic diagrams of the method for fabricating a dual damascene structure according to a first embodiment of the present invention.

Referring to FIGS. 5-13, FIGS. 5-13 are schematic diagrams of the method for fabricating a dual damascene structure according to a first embodiment of the present invention. The method is a via-first dual damascene structure method. First, a semiconductor device 50 comprising a substrate 52 is provided, wherein the semiconductor device 50 may be a semiconductor wafer. The substrate 52 comprises a conductive layer 54, an etching stop layer 56, and a dielectric layer 58 thereon, wherein the conductive layer 54 preferably comprises copper or other metal conductive material and the etching stop layer 56 may comprises silicon nitrogen (SiN). In addition, a pad layer (not shown), such as oxynitride (SiON) layer, may be disposed on the dielectric layer 58. Thereafter, a first photoresist layer 60 is coated above the surface of the dielectric layer 58. A photolithography process is carried out to pattern the first photoresist layer 60 so as to form a via pattern 62 on the first photoresist layer 60.

Figure 6:
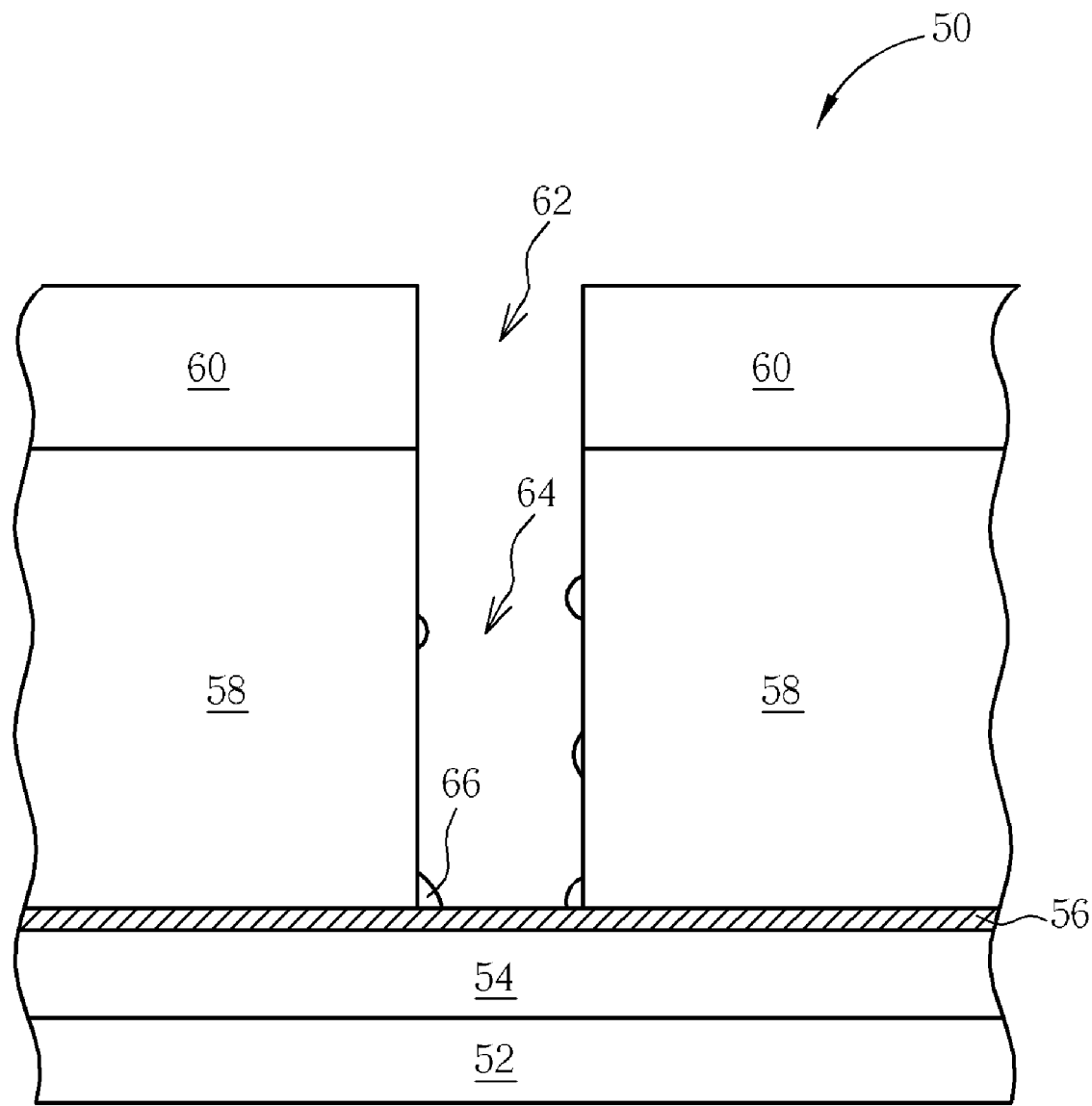
Figure 7:
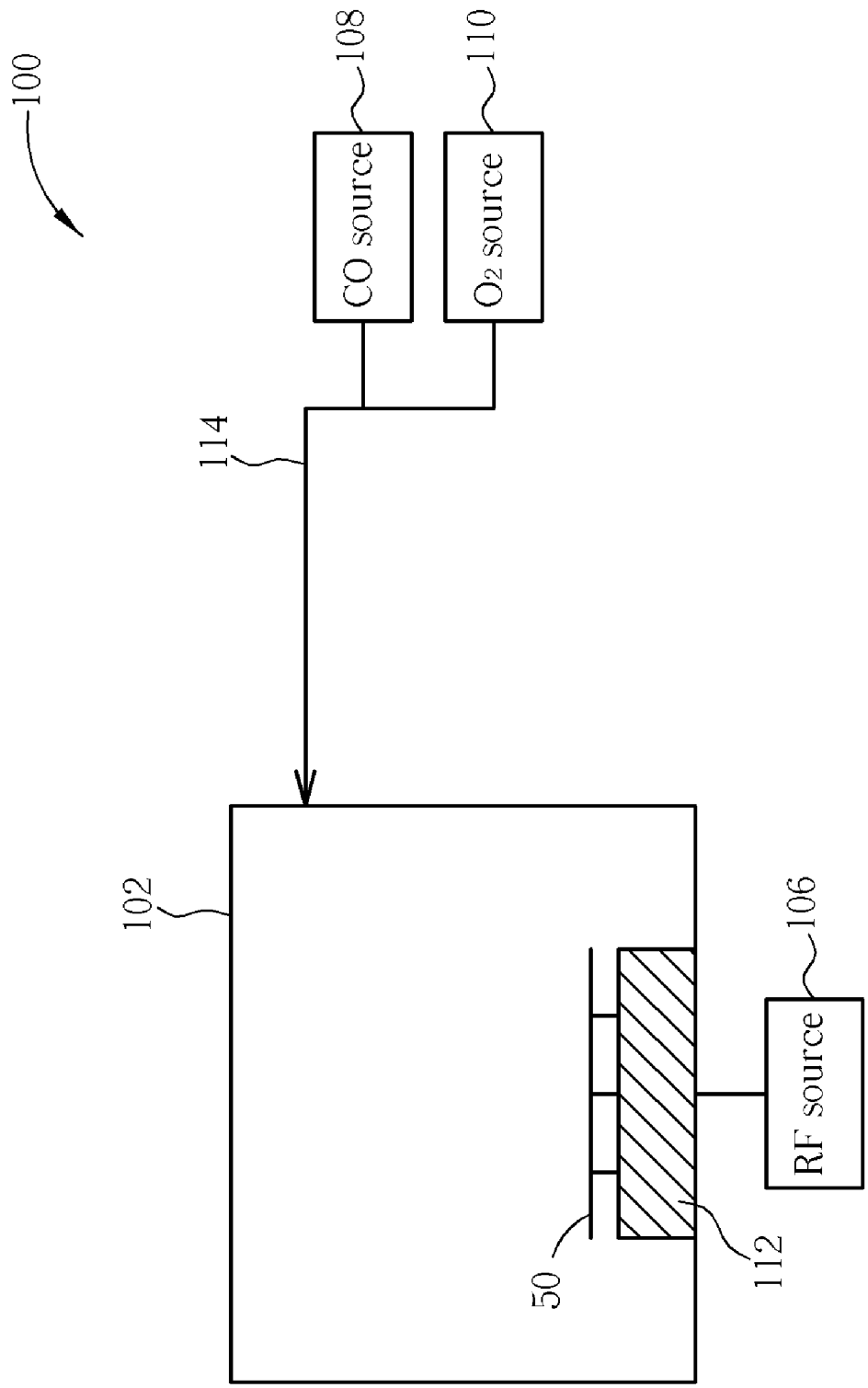

As shown in FIG. 6, a first etching process is performed for etching the dielectric layer 58 through the via pattern 62. Accordingly, a via hole 64 is formed in the dielectric layer 58. At this time, after-etching residues 66 are usually remained on the sidewall surface and bottom corner of the via hole 64. Normally, the residues 66 comprise polymers with carbon, nitrogen, silicon, fluorine, and titanium.

Figure 8:
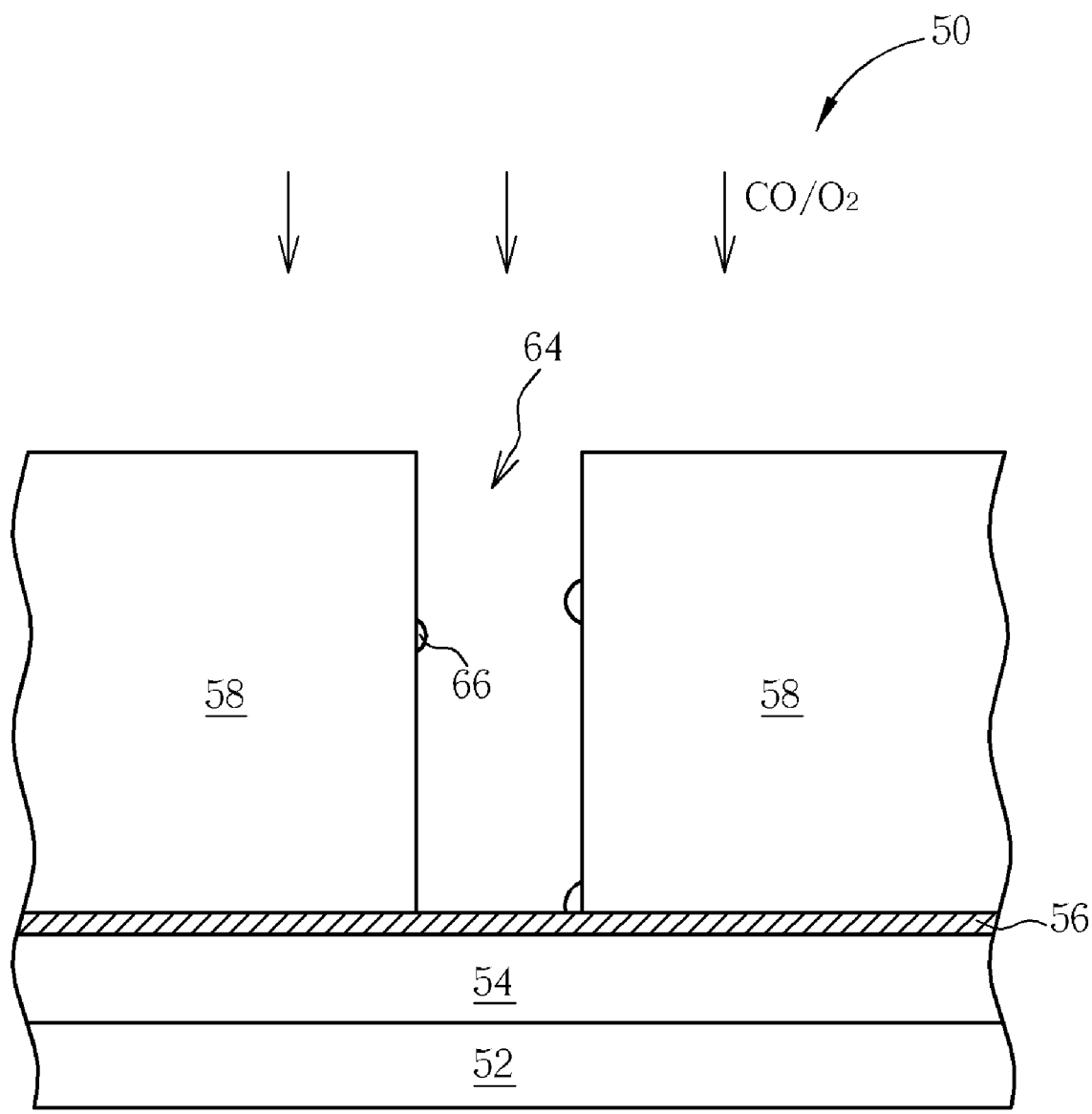

Then, a first ash process is performed to remove the first photoresist layer 60. Please refer to FIG. 7, the first ash process may be practiced by the process apparatus 100. The apparatus 100 comprises a reaction chamber 102, a radio frequency (RF) generator 106, a CO supply source 108, and an oxygen ($O_2$) supply source 110. The reaction chamber 102 comprises a chuck 112 for supporting the semiconductor device 50, and the RF generator 106 is connected to the chuck 112. In order to effectively clean the residues 66, CO-containing gas is utilized to remove the first photoresist layer 60 in the first ash process according to the present invention. As shown in FIG. 8, the first ash process is carried out by providing about 20 to 100 standard cubic centimeters per minute (sccm) of CO gas through the CO supply source 108 with about 15 to 30 seconds, under a pressure of about 30 to 100 mTorr and at a total power of about 200 to 1000 watt. In addition, during the first ash process, about 200 to 800 sccm of $O_2$ can be further provided together with the CO gas. Since CO is utilized as the reactant gas of the first ash process, the cleaning efficiency of residues 66 with $C_xF_y$ or fluorine materials can be obviously improved so that less residues 66 are remained in the via hole 64 after the first ash process. The reaction equation of the above-mentioned reaction is as below:

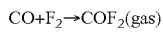

$$CO+F_2 \rightarrow COF_2(gas)$$

Furthermore, the first ash process with CO as reactant gas does not cause loss of SiN etching stop layer 56.

Figure 9:
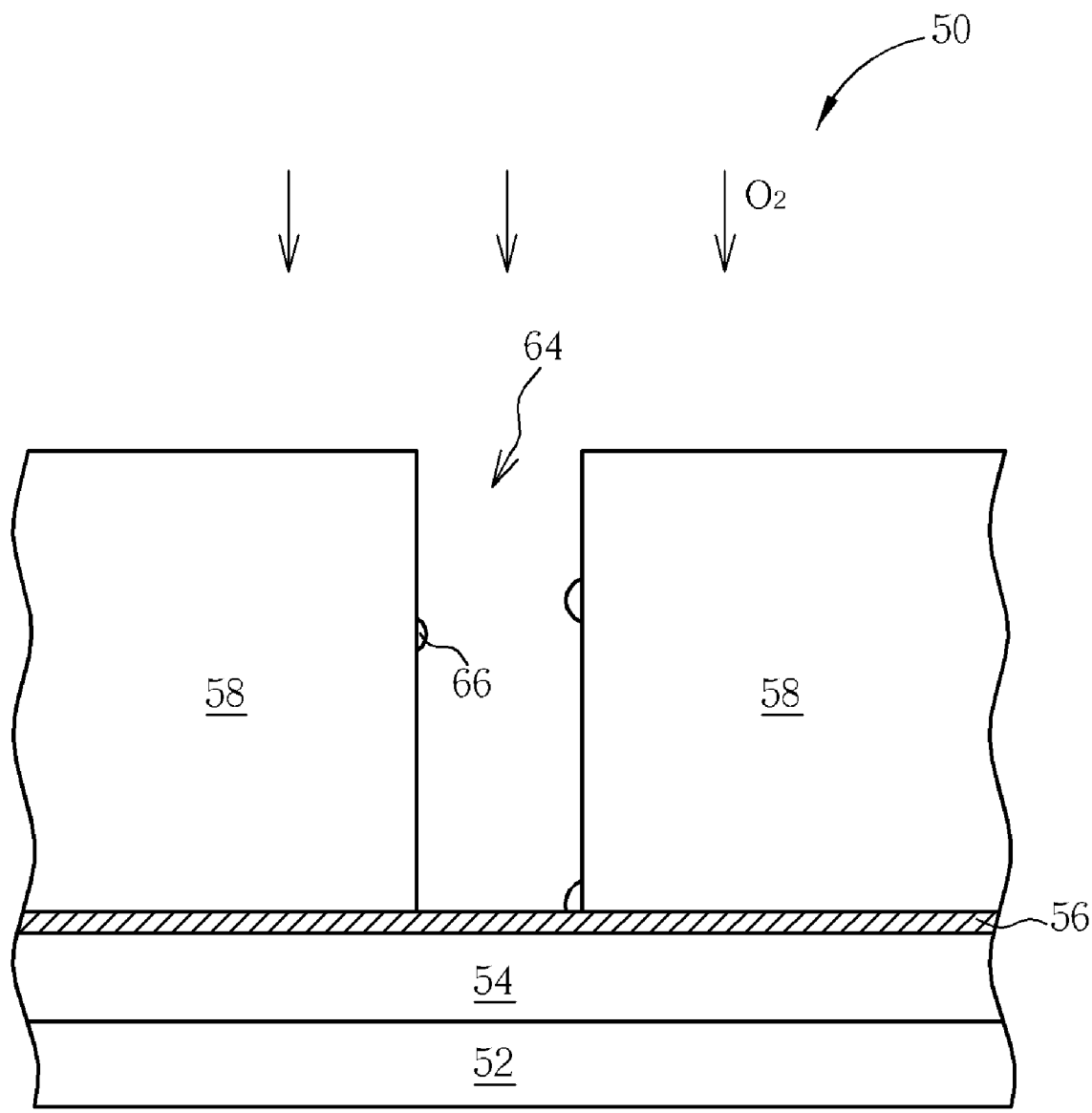
Figure 10:
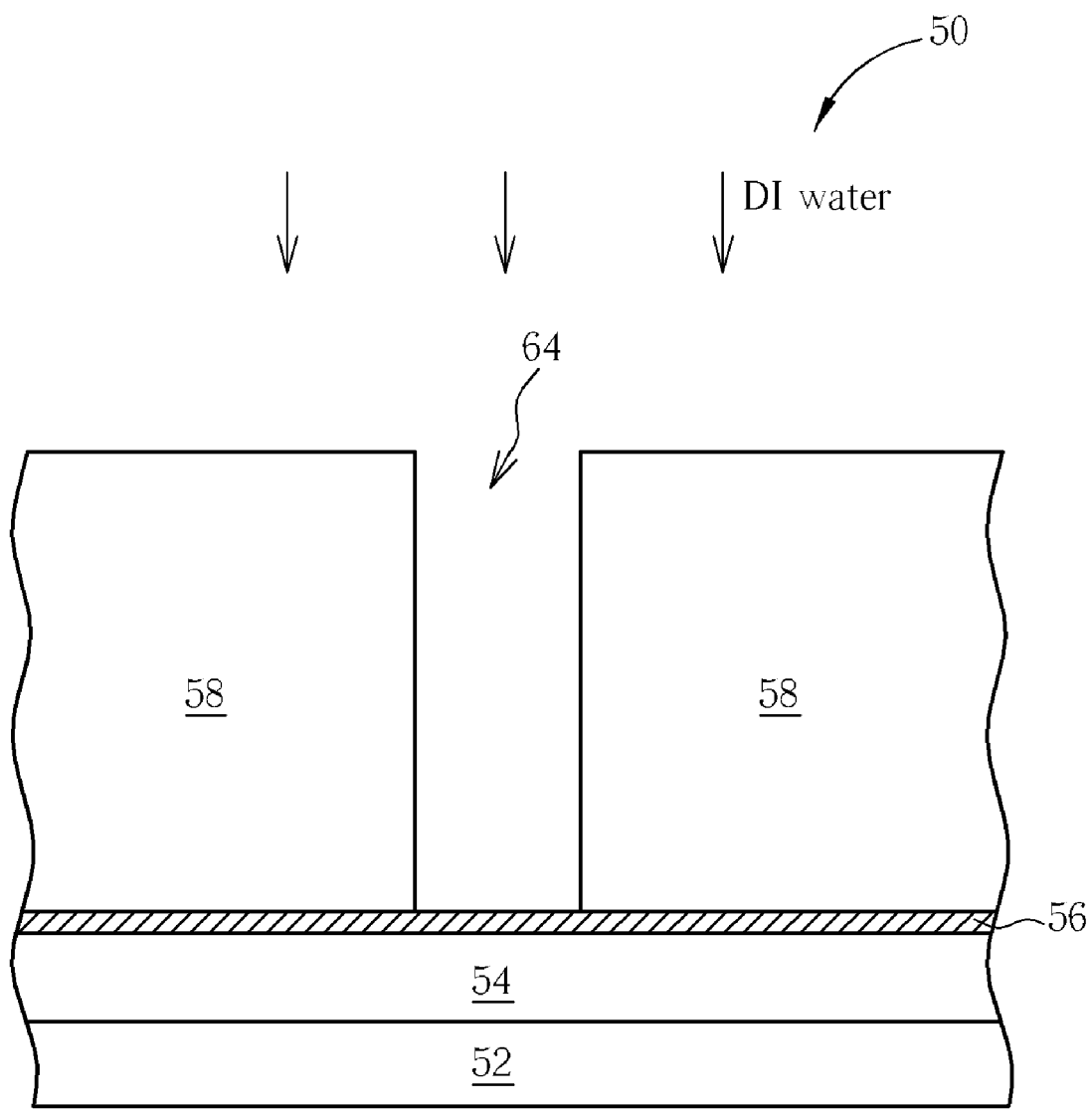

Next, with reference to FIG. 9, a second ash process is performed by introducing about 200 to 2000 sccm of $O_2$ into the reaction chamber 102, under a pressure of about 200 to 800 mTorr and at a total power of about 500 to 2000 watt. The process time is about 40 to 90 seconds. Then, as shown in FIG. 10, a DI water cleaning process is performed to clearly remove the residues 66 in the via hole 64. As mentioned above, since CO is introduced into the reaction chamber 102 during the first ash process, $C_xF_y$ residues can be quenched to improve the cleaning efficiency. Accordingly, the present invention method only needs to provide DI water for effectively removing the residues 66 in the via hole 64 and on the dielectric layer 58 after the ash processes. In various embodiments, a wafer backside cleaning process may be performed before the DI water cleaning process. In particular apparatuses, the wafer backside cleaning process comprises turning the semiconductor device 50 or the semiconductor wafer upside down, cleaning the wafer backside with cleaning solvent, such as sulfuric acid, turning the semiconductor device 50 back so that its obverse side is on top, and cleaning the obverse side of the semiconductor device 50 with DI water. The step of cleaning the obverse side of the semiconductor device 50 with DI water of the wafer backside cleaning process also can effectively remove the residues 66 after the first ash process, thus it may replace the above-mentioned DI water cleaning process for clearly removing residues 66 by further providing DI water shown in FIG. 10.

Figure 11:
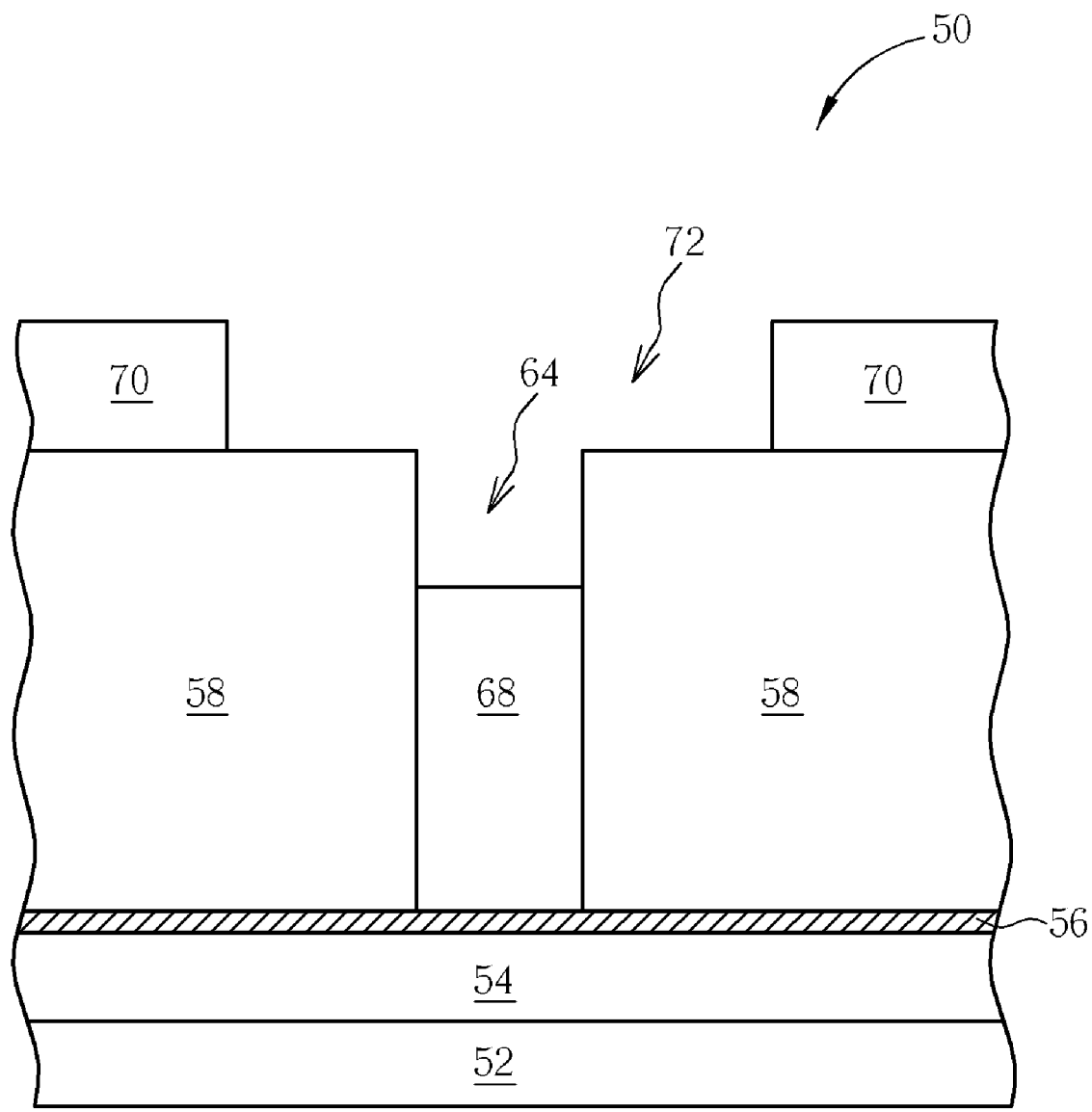

Please refer to FIG. 11, a GFP layer 68 is coated on the substrate 52, so that the via hole 64 is filled with the GFP layer 68. Conventionally, the GFP layer 68 is composed with I-Line photoresist (applied to 365 nm of wavelength). The coating process of the GFP layer 68 is similar to usual photoresist coating processes, and optional post-baking step may be carried out if desired. Then, the GFP layer 68 is etched back to a predetermined depth. Thereafter, a second photoresist layer 70 is coated on the substrate 50, while the portion of the via hole 64 not filled with the GFP materials is also coated with the second photoresist layer 70. A second photolithography process is performed to pattern the second photoresist layer 70 so as to form a trench pattern 72 in the second photoresist layer 70.

Figure 12:
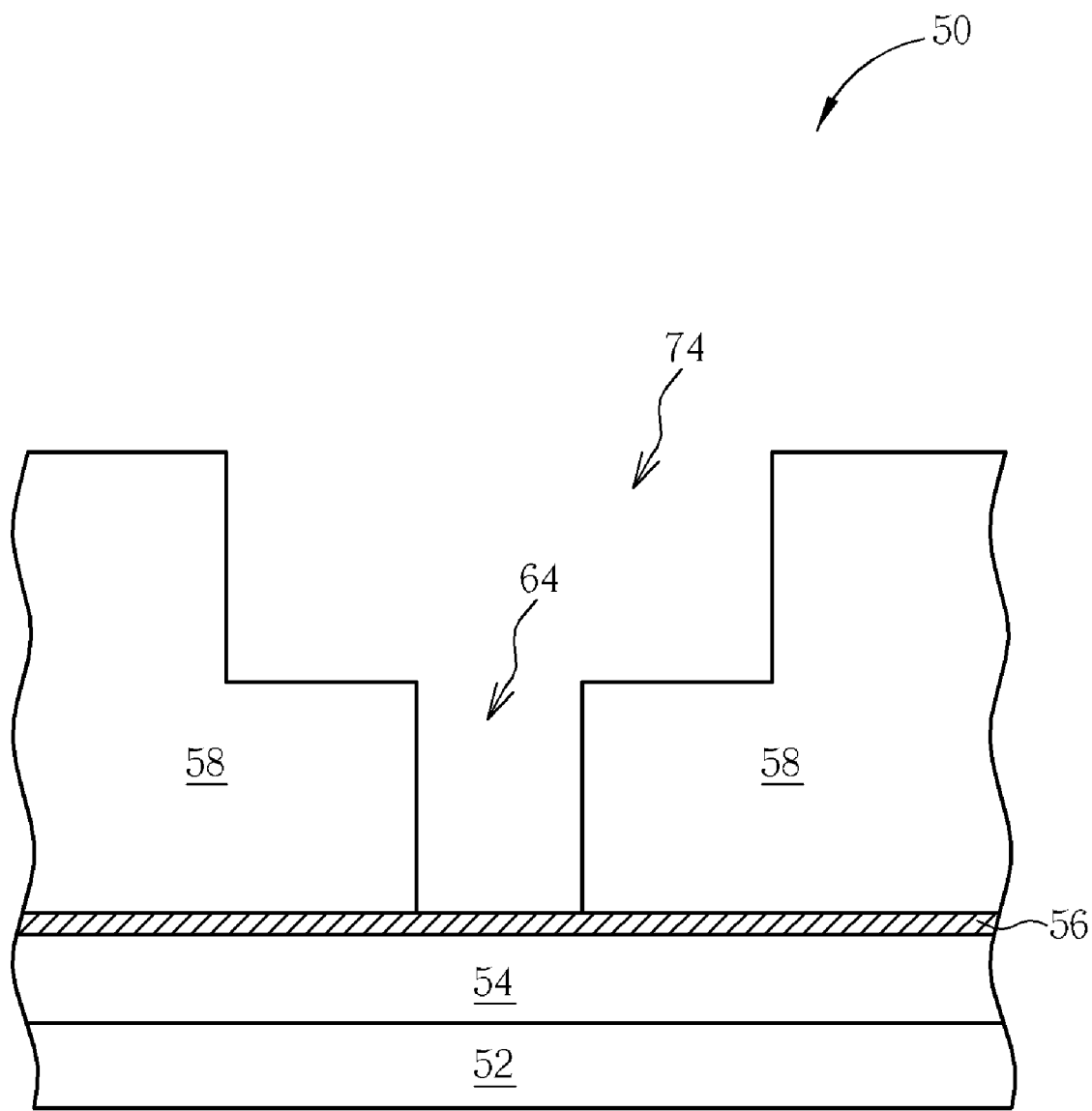
Figure 13:
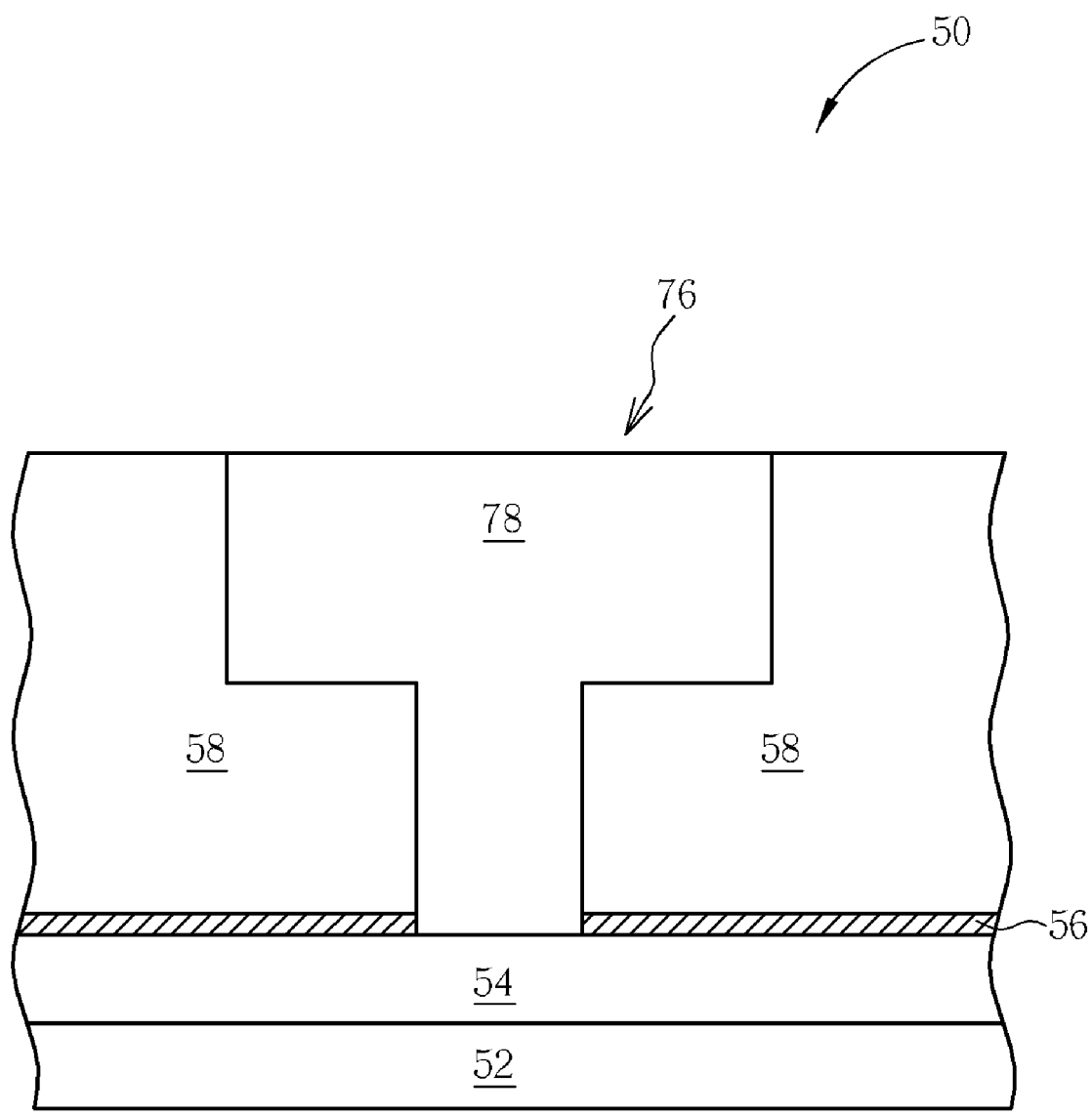
Figure 14:
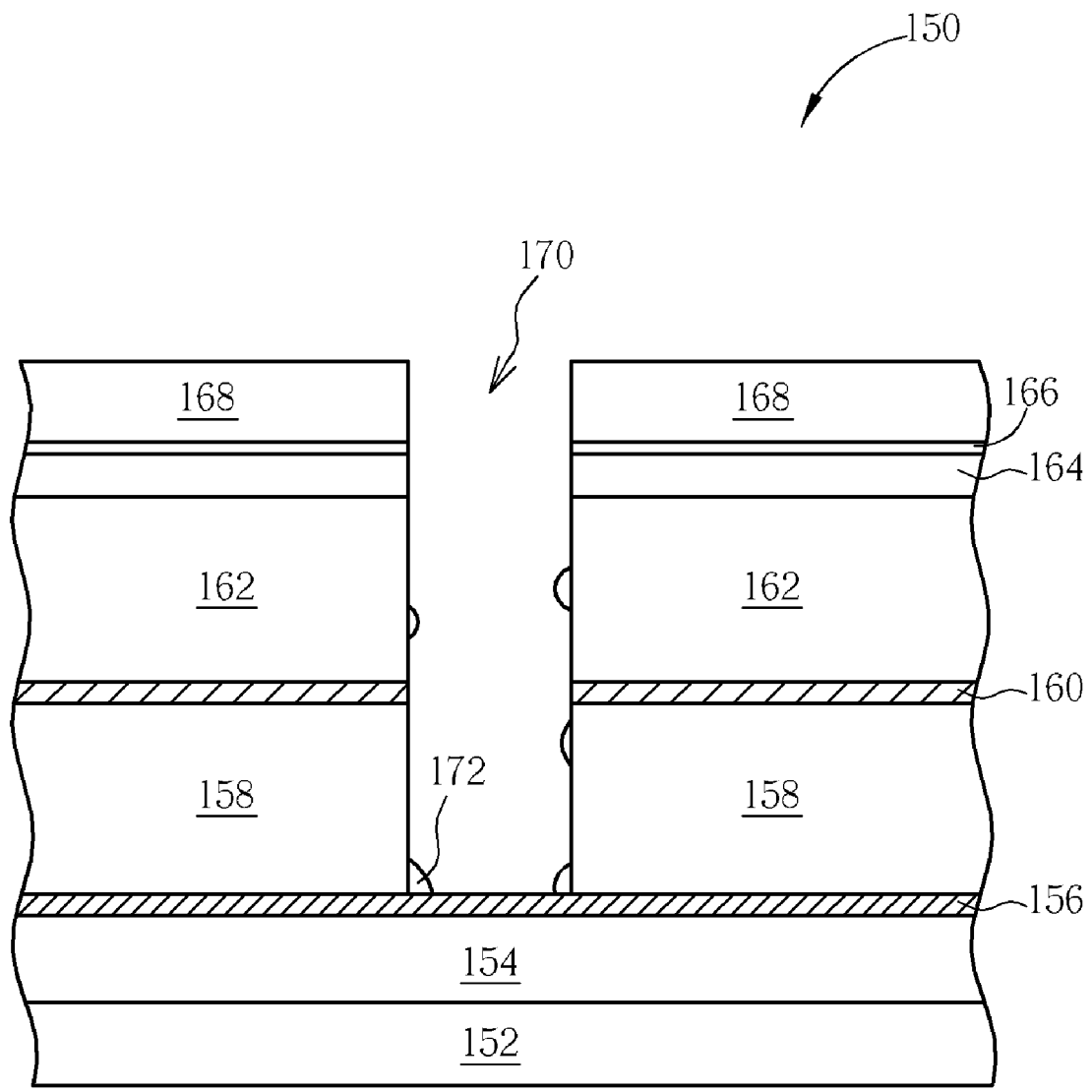
FIGS. 14-19 are schematic diagrams of the method for fabricating a dual damascene structure according to a second embodiment of the present invention.

As shown in FIG. 12, a second etching process is carried out to etch the dielectric layer 58 to a predetermined depth, through the trench pattern 72. Accordingly, a trench 74 is formed in the upper portion of the dielectric layer 58. Sequentially, the second photoresist layer 70 and the GFP layer 68 in the via hole 64 are removed so as to expose the etching stop layer 56. Referring to FIG. 13, the exposed etching stop layer 56 is then removed. Finally, a chemical vapor deposition (CVD) process or a sputtering process may be performed to form a conductive layer 78 in the trench 74 and the via hole 64, wherein the conductive layer 78 may comprises copper, aluminum, or other metal materials. A polishing process may be carried out if desired. Therefore, the fabrication of the dual damascene structure 76 is finished.

Please refer to FIGS. 14-19, which are schematic diagrams of the method for fabricating a dual damascene structure according to a second embodiment of the present invention. First, a semiconductor device 150 is provided, the semiconductor device 150 comprises a substrate 152. A conductive layer 154, a first etching stop layer 156, a bottom dielectric layer 158, a second etching stop layer 160, a upper dielectric layer 162, an oxynitride pad layer 164, and an oxide pad layer 166 are disposed on the substrate 152 from bottom to top. The first etching stop layer 156 may comprises nitride materials, and the second etching stop layer 160 may comprises oxynitride materials. Then, a patterned first photoresist layer 168 is formed on the surface of the oxide pad layer 166, wherein the first photoresist layer 168 comprises a via pattern. A first etching process is performed to remove portions of the upper dielectric layer 162, the second etching stop layer 160, and the bottom dielectric layer 158 exposed by the via pattern, until the surface of the first etching stop layer 158 is exposed. Therefore, a via hole 170 is formed. At this time, residues 172 are remained through the first etching process on the sidewall of the via hole 170.

Figure 15:
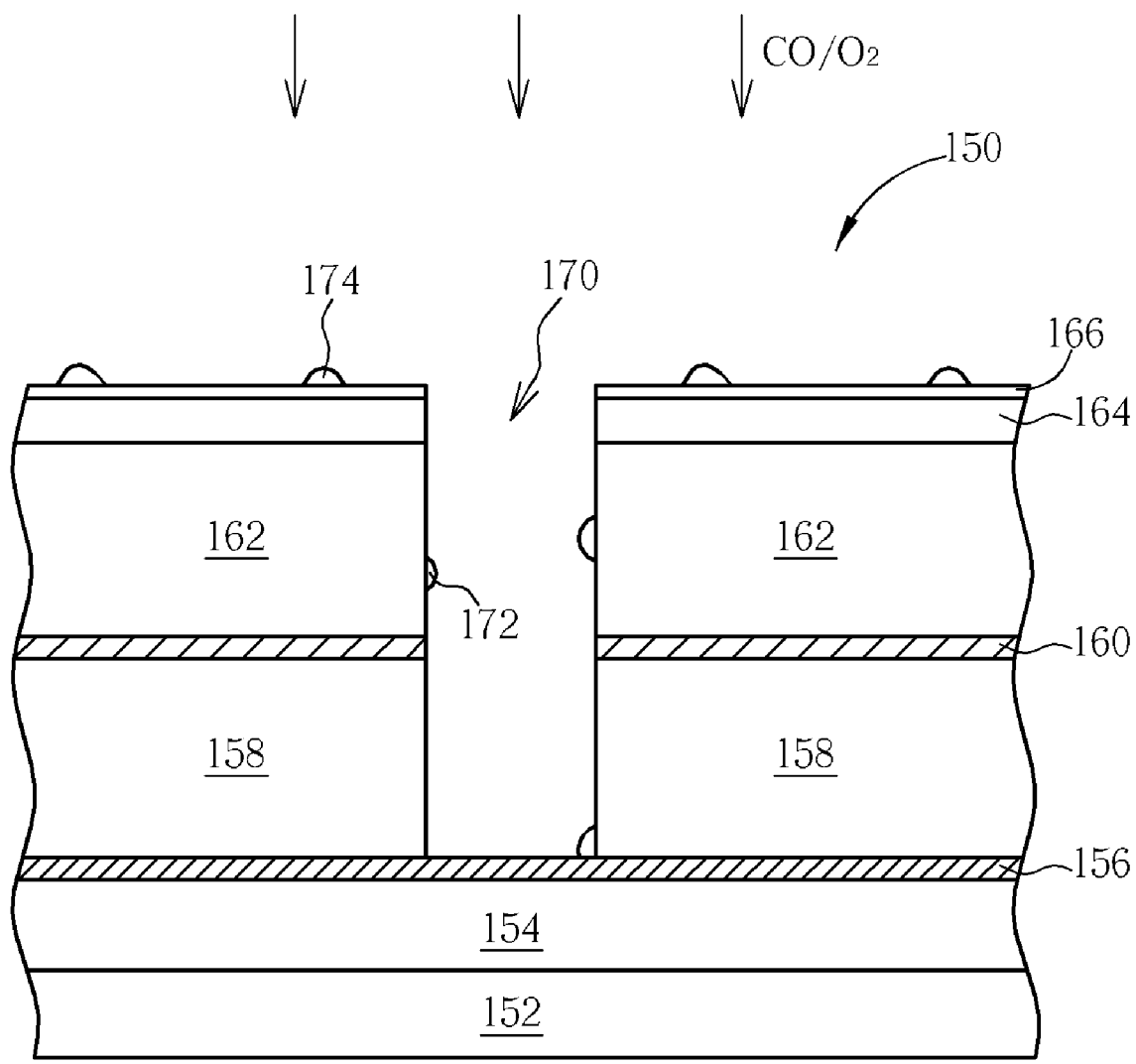
Figure 16:
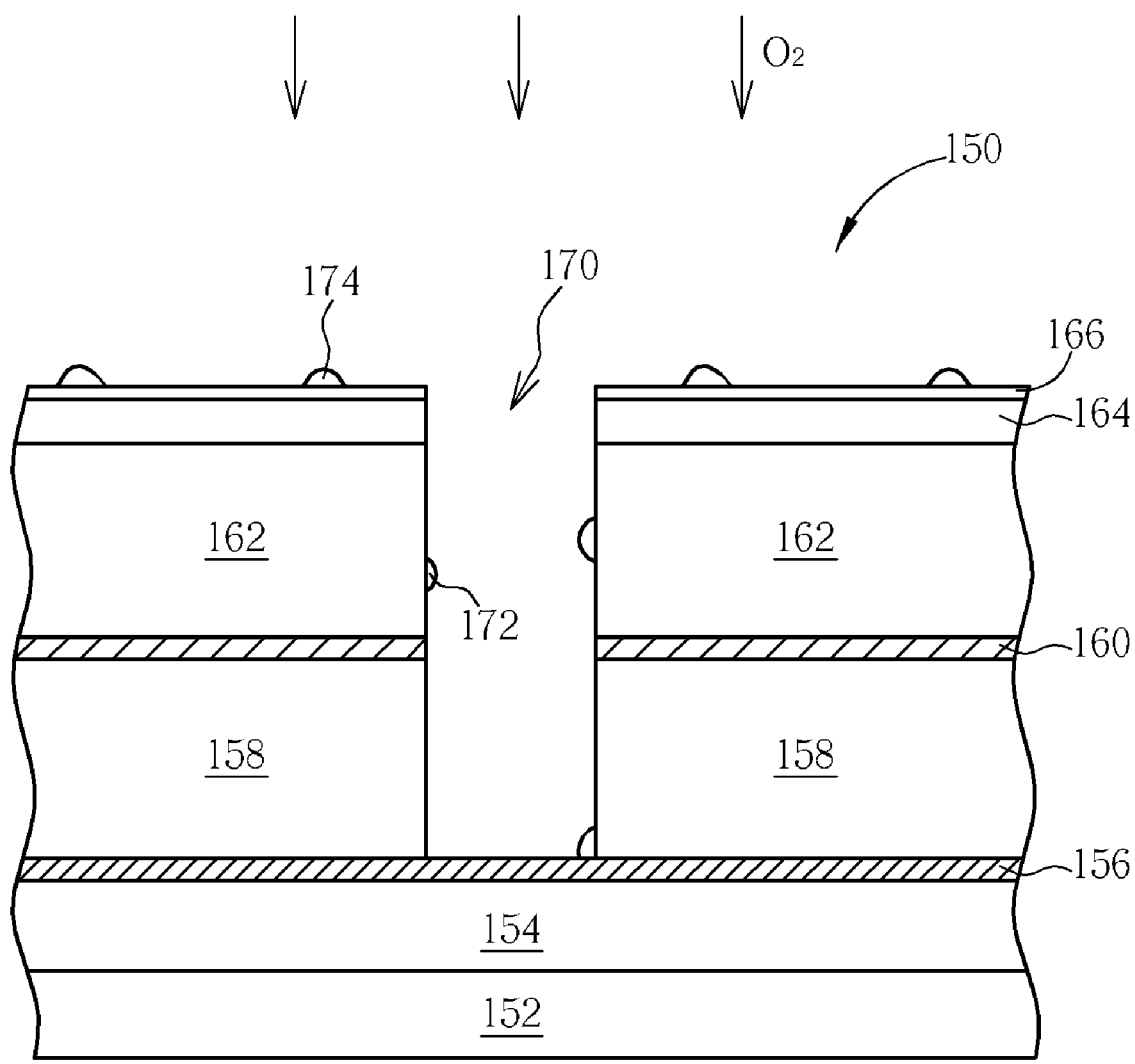
Figure 17:
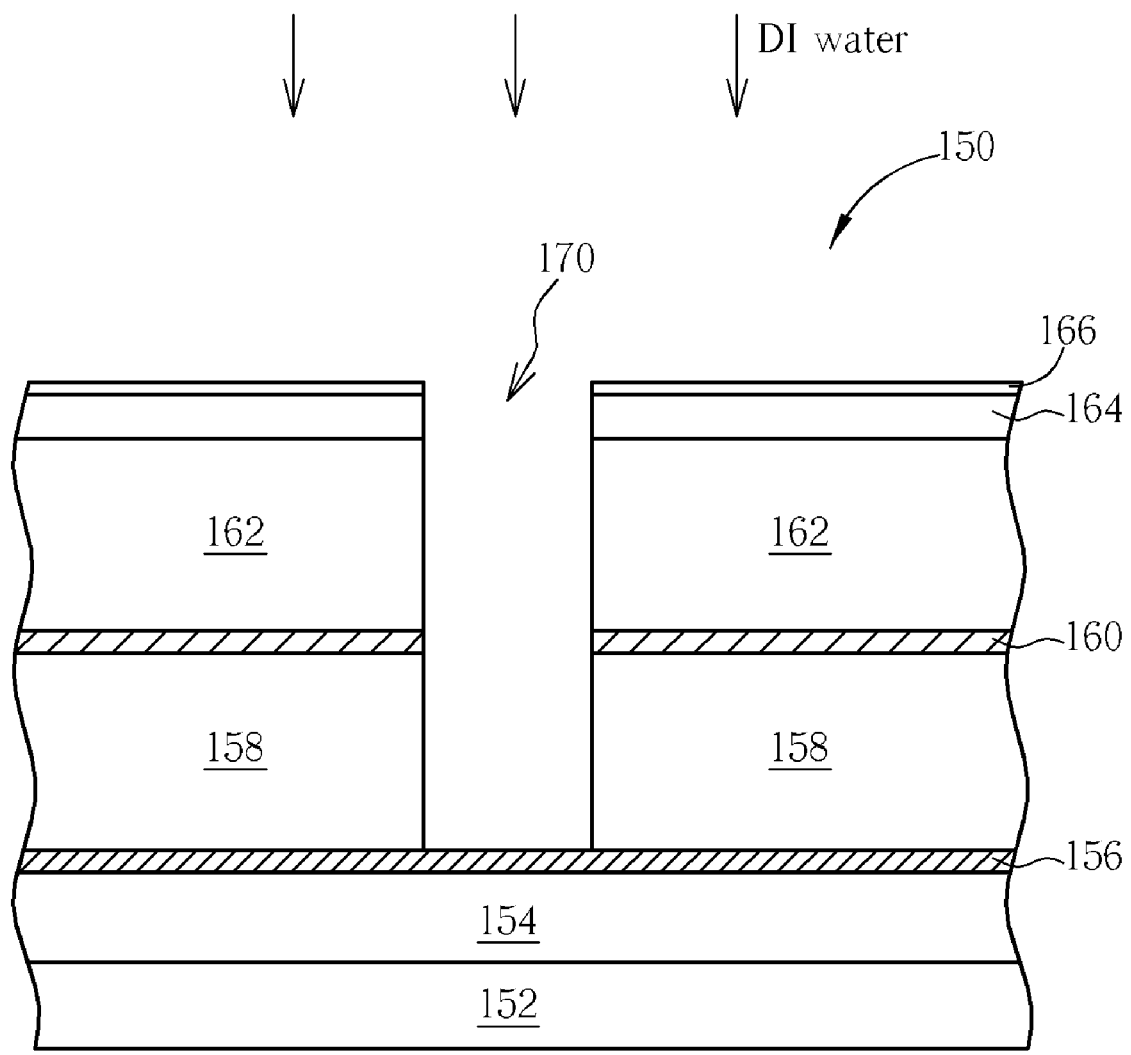

As shown in FIG. 15, a first ash process is carried out to provide $CO/O_2$ gas for removing the first photoresist layer 168 and some residues 172 at the same time, however, some photoresist residues 174 are remained on the surface of the oxide pad layer 166. Thereafter, as shown in FIG. 16, $O_2$ is further provided to perform a second ash process to the semiconductor device 150 followed with a DI water cleaning process so as to clearly clean the residues 172 in the via hole 170 and residues 174 on the oxide pad layer 166, as shown in FIG. 17.

Figure 18:
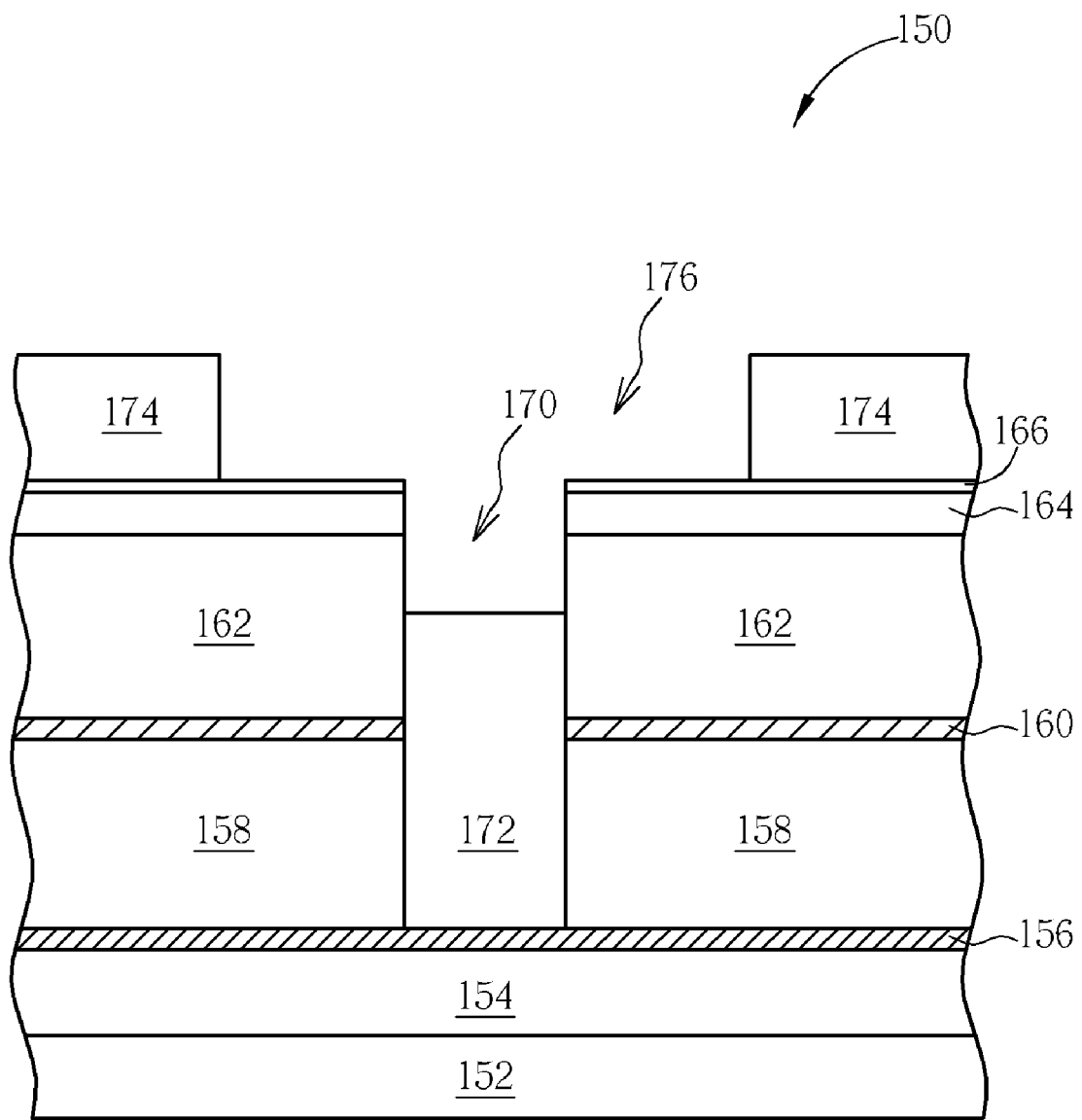
Figure 19:
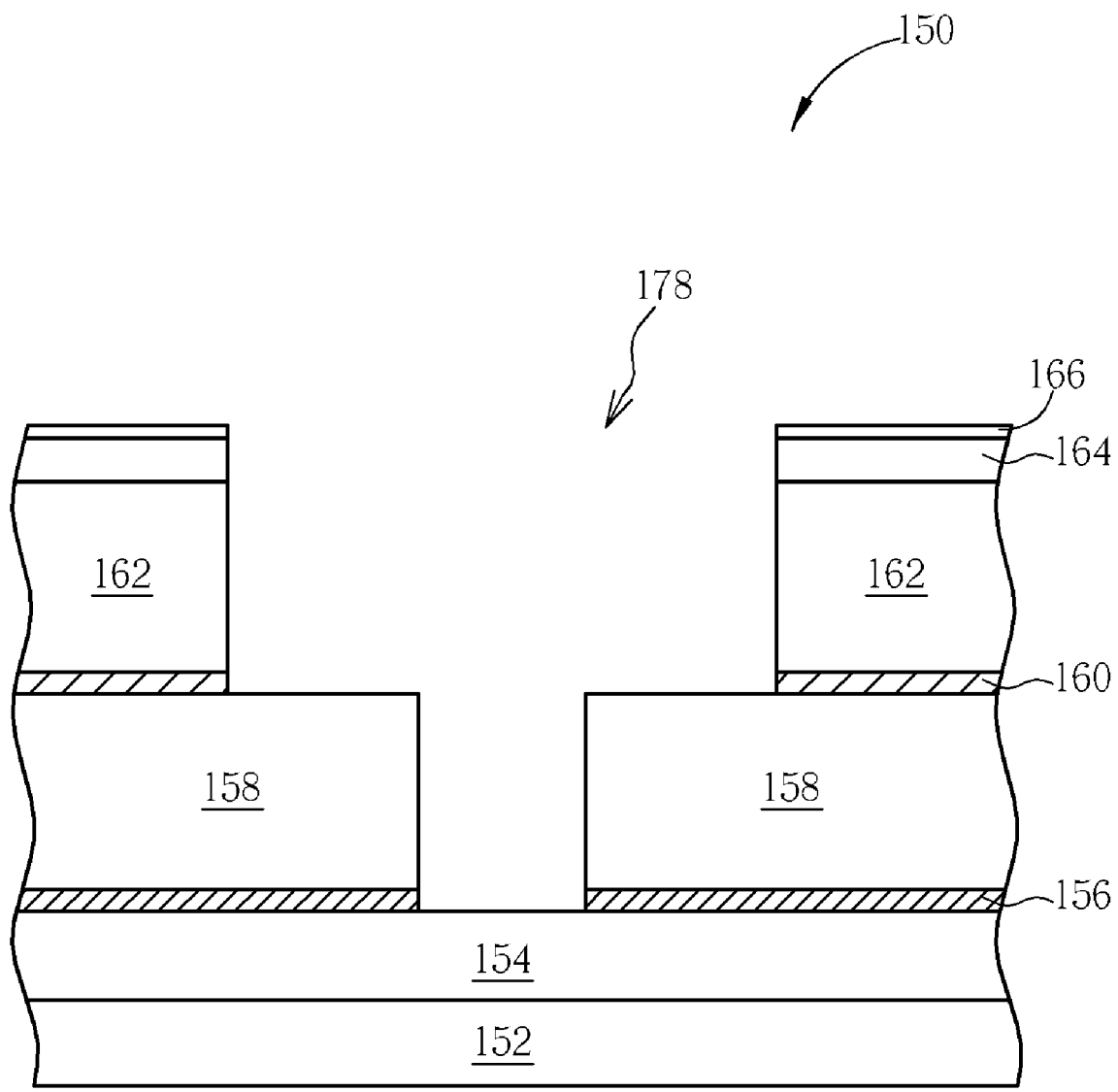

Referring to FIG. 18, GFP layer 172 is filled into the via hole 170, wherein the GFP layer 172 may be formed with conventional photoresist coating and baking processes. Then, the GFP layer 172 is etched back to form a concave opening in the via hole 170. A second photoresist layer 174 is coated on the surface of the substrate 152, and a photolithography process is performed to pattern the second photoresist layer 174 so as to form a trench pattern 176. As shown in FIG. 19, a second etching process is performed to remove portions of the oxide pad layer 166, the oxynitride pad layer 164, and the upper dielectric layer 162 through the trench pattern 176, until the second etching stop layer 160. Accordingly, a dual damascene opening 178 is formed. Finally, the second photoresist layer 174 and the GFP layer 172 are removed, then the exposed first etching stop layer 156 is also removed. Thereafter, a metal conductive layer (not shown) is formed in the dual damascene opening 178 so as to finish the fabrication of the metal dual damascene structure.

Since the present invention method for cleaning a via hole provides CO as a reactant gas during an ash process, it can quench $C_xF_y$ residues and improve the cleaning efficiency of residues. Therefore, only DI water is needed for effectively cleaning residues in the via hole after the ash processes, and the high-cost liquid solvent used in the prior art is not needed anymore. As a result, the fabrication process cost may be obviously decreased. Furthermore, the ash process with CO gas is capable of effectively removing residues on the surface of via hole, such that a preferable CD may be maintained in the following processes, such as the steps of striping the etching stop layer having silicon nitride materials and forming conductive materials in the via hole. In addition, the cleaning method of a via hole may be applied to other processes having etching and ash steps for cleaning after-etching residues, such as trench-first dual damascene or partial-via hole dual damascene processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a dual damascene structure, comprising:

providing a substrate having a conductive layer, a first etching stop layer, a dielectric layer, and a first photoresist layer positioned on the surface of the substrate in order;

patterning the first photoresist layer so as to defined a via pattern on the first photoresist layer;

performing a first etching process to remove a portion of the dielectric layer through the via pattern, until the etching stop layer is exposed so as to form a via hole structure in the dielectric layer;

performing a first ash process to remove the first photoresist layer by providing a gas comprising carbon monoxide (CO-containing gas);

filling gap-fill polymer (GFP) materials into the via hole structure;

forming a second photoresist layer on the substrate;

patterning the second photoresist layer to define a trench pattern;

performing a second etching process to etch the dielectric layer though the trench pattern so as to form a trench structure on the upper portion of the dielectric layer, the trench structure exposing the via hole structure;

removing the second photoresist layer and the GFP materials in the via hole structure; and removing the first etching stop layer exposed by the via hole structure.

2. The method of claim 1, wherein the CO-containing gas further comprises oxygen ($O_2$).

3. The method of claim 2, wherein a flow rate of CO of the CO-containing gas is about 20 to 100 standard cubic centimeters per minute (sccm), and a flow rate of $O_2$ is about 200 to 800 sccm.

4. The method of claim 1, wherein the first ash process is performed at a total power of about 200 to 1000 watt.

5. The method of claim 1, wherein the first ash process is performed under a pressure of about 30 to 100 mTorr.

6. The method of claim 1, wherein a process time of the first ash process is about 15 to 30 seconds.

7. The method of claim 1, wherein the method further comprises performing a second ash process after the first ash process.

8. The method of claim 7, wherein the second ash process is practiced by providing an $O_2$-containing gas.

9. The method of claim 7, wherein a flow rate of $O_2$ of the $O_2$-containing gas is about 500 to 2000 sccm.

10. The method of claim 7, wherein the second ash process is performed at a total power of about 500 to 2000 watt.

11. The method of claim 7, wherein the second ash process is performed under a pressure of about 30 to 100 mTorr.

12. The method of claim 7, wherein a process time of the second ash process is about 40 to 90 seconds.

13. The method of claim 1, wherein the method further comprises performing a DI water cleaning process to remove residues resulting from the first etching process after the first ash process.

14. The method of claim 1, wherein the method further comprises performing a wafer backside cleaning process after the first ash process.

15. The method of claim 1, wherein the dielectric layer comprises a upper dielectric layer and a bottom dielectric layer, and the substrate further comprises a second etching stop layer positioned between the upper dielectric layer and the bottom dielectric layer.

16. The method of claim 15, wherein the second etching process removes the upper dielectric layer through the trench pattern until the second etching stop layer.

17. The method of claim 1, wherein the method further comprises forming a conductive layer in the via hole structure and the trench structure after removing the first etching stop layer in the via hole structure so as to form a dual damascene structure.

18. A method for cleaning a via hole structure, comprising:
providing a semiconductor device, which comprises a substrate and a dielectric layer on the substrate;
forming a patterned photoresist layer on the dielectric layer;
etching through the dielectric layer by utilizing the patterned photoresist layer as an etching mask to form the via hole structure;
providing a reaction chamber for containing the semiconductor device; and
introducing CO-containing gas into the reaction chamber.

19. The method of claim 18, wherein the CO-containing gas farther comprises oxygen.

20. The method of claim 19, wherein a flow rate of CO of the CO-containing gas is about 20 to 100 sccm, and a flow rate of oxygen is about 200 to 800 sccm.

21. The method of claim 18, wherein the CO-containing gas is introduced at a total power of about 200 to 1000 watt.

22. The method of claim 18, wherein the CO-containing gas is introduced under a pressure of about 30 to 100 mTorr.

23. The method of claim 18, wherein a process time of introducing the CO-containing gas is about 15 to 30 seconds.

24. The method of claim 18, wherein the method farther comprises introducing an $O_2$-containing gas into the reaction chamber after introducing the CO-containing gas into the reaction chamber.

25. The method of claim 24, wherein a flow rate of $O_2$ in the $O_2$-containing gas is about 500 to 2000 seem.

26. The method of claim 24, wherein the $O_2$-containing gas is introduced at a total power of about 500 to 2000 watt.

27. The method of claim 24, wherein the $O_2$-containing gas is introduced under a pressure of about 30 to 100 mTorr.

28. The method of claim 24, wherein a process time of introducing the $O_2$-containing gas is about 40 to 90 seconds.

29. The method of claim 18, wherein the method further comprises performing a DI water cleaning process to remove residues formed in the step of etching through the dielectric layer after introducing the CO-containing gas into the reaction chamber.

30. The method of claim 18, wherein the method further comprises performing a wafer backside cleaning process after introducing the CO-containing gas into the reaction chamber.

* * * * *